United States Patent
Ishii et al.

(10) Patent No.: US 9,030,218 B2
(45) Date of Patent: May 12, 2015

(54) METHOD FOR THERMAL STABILIZATION OF PROBE CARD AND INSPECTION APPARATUS

(75) Inventors: Kazunari Ishii, Yamanashi (JP); Tetsuji Watanabe, Yamanashi (JP); Shinya Koizumi, Yamanashi (JP); Koichi Matsuzaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 151 days.

(21) Appl. No.: 13/978,411

(22) PCT Filed: Dec. 9, 2011

(86) PCT No.: PCT/JP2011/079116
§ 371 (c)(1),
(2), (4) Date: Jul. 5, 2013

(87) PCT Pub. No.: WO2012/096099
PCT Pub. Date: Jul. 19, 2012

(65) Prior Publication Data
US 2013/0278279 A1  Oct. 24, 2013

(30) Foreign Application Priority Data
Jan. 13, 2011  (JP) .................................. 2011-005013

(51) Int. Cl.
*G01R 1/073* (2006.01)
*G01R 31/28* (2006.01)

(52) U.S. Cl.
CPC ........ *G01R 1/07342* (2013.01); *G01R 31/2891* (2013.01); *G01R 31/2863* (2013.01)

(58) Field of Classification Search
None
See application file for complete search history.

(56) References Cited

U.S. PATENT DOCUMENTS

| 7,235,984 B2 * | 6/2007 | Honma .................... 324/662 |
| 8,081,007 B2 * | 12/2011 | Yamamoto et al. ...... 324/750.16 |
| 2009/0128178 A1 | 5/2009 | Matsuzawa |
| 2009/0153170 A1 * | 6/2009 | Hagihara .................. 324/758 |

FOREIGN PATENT DOCUMENTS

| JP | 2004 266206 | 9/2004 |
| JP | 2007 88203 | 4/2007 |

OTHER PUBLICATIONS

International Search Report Issued Jan. 31, 2012 in PCT/JP11/079116 filed Dec. 9, 2011.

* cited by examiner

*Primary Examiner* — Minh N Tang
(74) *Attorney, Agent, or Firm* — Oblon, McClelland, Maier & Neustadt, L.L.P.

(57) ABSTRACT

In a method for thermal stabilization of a probe card, a probe card is adjusted to a prescribed temperature in a short time by making a heat source directly contact the probe card and is accurately determined whether the probe card is thermally stable. A heat transfer substrate is mounted on a mounting table. The temperature of the heat transfer substrate is adjusted through the mounting table. The mounting table is raised, and a plurality of probes is brought into contact with the heat transfer substrate at a prescribed target load. The contact load between the heat transfer substrate and the probes, which changes according to the thermal changes in the probe card, is detected. The mounting table is controlled vertically through a vertical drive mechanism such that the contact load becomes the target load until the probe card is thermally stable.

10 Claims, 7 Drawing Sheets

METHOD FOR THERMAL STABILIZATION OF PROBE CARD AND INSPECTION APPARATUS

FIELD OF THE INVENTION

The present invention relates to a method for thermal stabilization of a probe card and an inspection apparatus; and, more particularly, to a method for thermal stabilization of a probe card and an inspection apparatus, which are capable of thermally stabilizing a probe card in a short period of time.

BACKGROUND OF THE INVENTION

A conventional inspection apparatus includes: a movable mounting table for mounting thereon, e.g., an inspection target (e.g., wafer); a probe card having a plurality of probes, disposed above the mounting table; a temperature control unit for controlling a temperature of the mounting table; an alignment unit for aligning the probes of the probe card and a plurality of electrode pads of the wafer on the mounting table; and a control unit for controlling the mounting table, the temperature control unit and the alignment unit. The conventional inspection apparatus is configured to control the wafer on the mounting table to a predetermined temperature by the temperature control unit and bring the electrode pads of the wafer into electrical contact with the probes of the probe card under the control of the control unit, to thereby inspect electrical characteristics of a plurality of devices formed on the wafer by a predetermined contact load.

Therefore, the inspection apparatus performs high-temperature inspection by heating a wafer to a temperature of, e.g., about 150° C., or low-temperature inspection by cooling an inspection target to a temperature of, e.g., about minus several tens of degrees Celsius. In the case of performing the high-temperature inspection or the low-temperature inspection, the wafer is heated or cooled to a predetermined inspection temperature by using a temperature control unit built in the mounting table, and the mounting table is raised by a vertical drive mechanism to bring the devices into contact with the probes by a predetermined contact load.

When the electrical characteristics of the wafer are inspected under a high temperature of, e.g., about 150° C., the wafer is heated to a high temperature of about 150° C. by the temperature control unit in an initial stage of the inspection. Since, however, the probe card is not heated, the wafer and the probe card have a large temperature difference. Therefore, when the first device and the probes are brought into contact with each other by a predetermined contact load, the probe card is heated by heat emitted from the wafer during the inspection. As a consequence, the probe card is thermally expanded gradually, and tip heights of the probes are changed by several tens of μm. Since the contact load with respect to the wafer becomes excessive, the reliability of the inspection deteriorates. In some cases, the devices or the probes may be damaged.

Hence, in a conventional inspection method, as shown in FIG. 5, for example, the mounting surface of the mounting table 1 is moved toward the probe side 2 to a position spaced from the tip positions of the probes 2A of the probe card 2 by a distance of about 5 (e.g., several hundreds of μm) (separated distance), and the probe card 2 is pre-heated and thermally expanded by the heat emitted from the pre-heated mounting table 1. When the tip positions of the probes 2A are not changed any more, the electrical characteristics of the wafer are inspected.

The pre-heating of the probe card 2 and the inspection of electrical characteristics of the wafer are carried out in accordance with the flowchart shown in FIG. 6, for example. Specifically, in order to initiate inspection of a wafer in any lot, first, the mounting table 1 is moved to carry out alignment of the probes 2A of the probe card 2 by using the a CCD camera 3 provided at a side of the mounting table, and the tip positions of the probes 2A are detected (step S1). Then, it is waited until the mounting table 1 reaches a predetermined temperature (substantially equal to the temperature of the mounting table) (step S2). When the mounting table 1 reaches the predetermined temperature, the mounting table 1 is moved to a position immediately below the probe card 2 as shown in FIG. 5 and then raised to and stopped at a position separated from the tip positions of the probes 2A by a distance of several hundred μm. In that position, the probe card 2 is pre-heated by the heat emitted from the mounting table 1 (step 3). Upon completion of the pre-heating, the probe alignment is performed by using the CCD camera 3 (step S4). Next, a probe grinding wafer is mounted on the mounting table 1, and the probes 2A are polished by using the probe grinding wafer on the mooting table 1 (step S5). Upon completion of the grinding operation, the probe alignment is performed to detect the tip positions of the probes (step S7). Thereafter, a target wafer of the corresponding lot is transferred and mounted on the mounting table 1 (step S8). Next, the electrical characteristics of the wafer are inspected.

Meanwhile, in the conventional inspection method, the pre-heating requires several tens of minutes or a longer period of time such as several hours depending on types of probe cards, which results in decrease of practical operation time of the apparatus. Further, in the conventional pre-heating, there is no function of detecting whether or not the probe tip height is stable. Therefore, the pre-heating is executed for a sufficient period of time regardless of types of probes, or the pre-heating is executed by calculating the estimated time of the pre-heating for each type of probe cards.

Accordingly, there have been proposed various methods capable of effectively performing pre-heating in a short period of time. For example, Japanese Patent Application Publication No. 2007-088203 discloses a technique for pre-heating a probe card by bringing a plurality of probes of the probe card into direct contact with a wafer whose temperature is adjusted to a predetermined inspection temperature and thermally stabilizing the probe card in a short period of time. Further, Japanese Patent Application Publication No. 2004-266206 discloses a technique for installing a heat plate for pre-heating on a movable supporting table provided in addition to the mounting table for the wafer and performing pre-heating by bringing the heat plate for pre-heating into direct contact with the probe card by moving the supporting table.

However, in the technique of Japanese Patent Application Publication No. 2007-088203, the position of the mounting table is corrected such that the probes are brought into contact with the wafer by a predetermined distortion amount based on the inspection temperature of the wafer and the elapsed time after the contact between the probes and the wafer. Therefore, the elapsed time after the contact of the probes with the wafer and the extension/contraction length data of the probes need to be collected at predetermined time intervals before the inspection of the wafer, and the data indicating the correlation between the elapsed time and the position correction value need to be created based on the collected data. In the technique of Japanese Patent Application Publication No. 2004-266206, the supporting table for supporting the heat plate for pre-heating should be provided in addition to the mounting table for the wafer, which results in scaling up of the inspection apparatus. Further, the low-temperature inspection for inspecting the wafer at a temperature of, e.g., about minus several tens of degrees Celsius, has the same problems as those of the high-temperature inspection.

SUMMARY OF THE INVENTION

In view of the above, the present invention provides a method for thermal stabilization of a probe card, and an inspection apparatus which are capable of thermally stabilizing a probe card to a predetermined temperature by adjusting the probe card to a predetermined temperature in a short period of time by bringing a heat source into direct contact with the probe card and also capable of accurately stabilizing the probe card by sequentially detecting thermal changes in the probe card.

In order to realize the above purposes, according to a first embodiment of the present invention, a horizontally and vertically movable mounting table; a probe card having a plurality of probes, disposed above the mounting table; a vertical drive mechanism configured to vertically move the mounting table; a temperature control unit configured to control a temperature of the mounting table; and a control unit configured to control the vertical drive mechanism and the temperature control unit, wherein before inspecting electrical characteristics of an inspection target at a predetermined temperature the probe card is thermally stabilized by mounting a heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, the method comprising: a first step of mounting the heat transfer substrate on the mounting table and adjusting a temperature of the heat transfer substrate through the mounting table; a second step of bringing the heat transfer substrate into contact with the probes at a predetermined target load by raising the mounting table; a third step of detecting the contact load between the heat transfer substrate and the probes which changes in conformity with thermal changes in the probe card that exchanges heat with respect to the heat transfer substrate; and a fourth step of controlling vertical movement of the mounting table through the vertical drive mechanism such that the contact load becomes equal to the predetermined target load, until the probe card is thermally stabilized.

In the present embodiment wherein the contact load is detected through a torque voltage of a motor included in the vertical drive mechanism.

In the present embodiment wherein the target load is obtained by overdriving the mounting table.

In the present embodiment wherein the heat transfer substrate is made of a highly thermal conductive material.

In order to realize the above purposes, according to a second embodiment of the present invention, a horizontally and vertically movable mounting table; a probe card having a plurality of probes, disposed above the mounting table; a vertical drive mechanism configured to vertically move the mounting table; a temperature control unit configured to control a temperature of the heat transfer substrate through the mounting table; and a control unit configured to control the vertical drive mechanism and the temperature control unit, wherein before inspecting electrical characteristics of an inspection target at a predetermined temperature the probe card is thermally stabilized by mounting the heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, the inspection apparatus further comprising: a load detector configured to detect the contact load, wherein the control unit controls the vertical movement of the mounting table through the vertical drive mechanism based on a signal from the load detector, until the probe card is thermally stabilized and the contact load is kept at the target load.

In the present embodiment wherein the target load is obtained by overdriving the mounting table.

In the present embodiment wherein the heat transfer substrate is made of a highly thermal conductive material.

In order to realize the above purposes, according to a third embodiment of the present invention, a horizontally and vertically movable mounting table; a probe card having a plurality of probes, disposed above the mounting table; an vertical drive mechanism configured to vertically move the mounting table; a temperature control unit configured to control a temperature of the heat transfer substrate through the mounting table; and a control unit configured to control the vertical drive mechanism and the temperature control unit, wherein before inspecting electrical characteristics of an inspection target at a predetermined temperature the probe card is thermally stabilized by mounting the heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, wherein the vertical drive mechanism includes: a motor; a rotational driving shaft, connected to the motor, for vertically moving the mounting table; a torque voltage detector for detecting a torque voltage of the motor during the rotation of the rotational driving shaft, and wherein the control unit has a central processing unit for converting the torque voltage from the torque voltage detector into a contact load between the heat transfer substrate and probes, and the vertical movement of the mounting table is controlled based on a signal from the torque voltage detector such that the contact load becomes the target load, until the probe card is thermally stabilized.

In the present embodiment wherein the target load is obtained by overdriving the mounting table.

In the present embodiment wherein the heat transfer substrate is made of a highly thermal conductive material.

EFFECTS OF THE INVENTION

In accordance with the present invention, it is possible to thermally stabilize the probe card can to a predetermined temperature in a short period of time by bringing a heat source into direct contact with the probe card, and also possible to accurately stabilize the probe card by sequentially detecting thermal changes in the probe card.

DETAILED DESCRIPTION OF THE EMBODIMENTS

Figure 1:
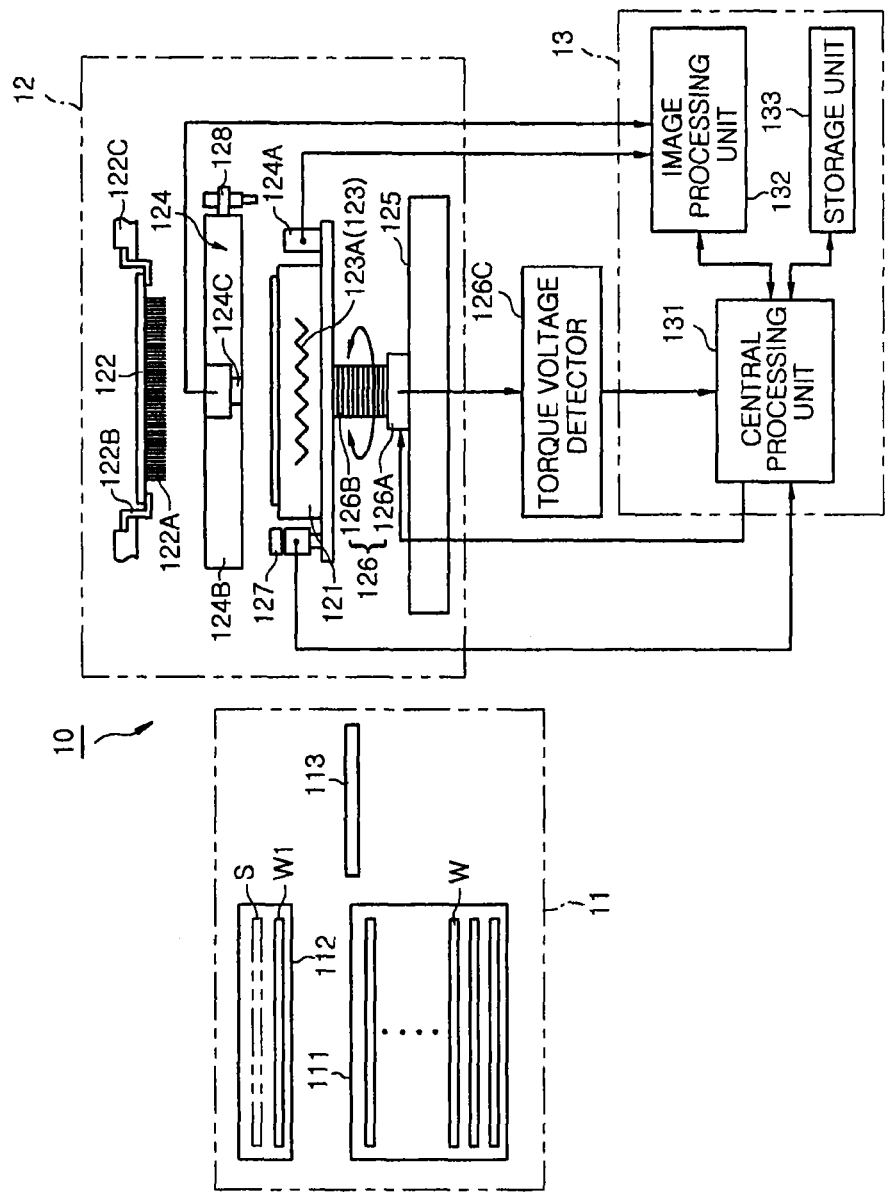
FIG. 1 shows an embodiment of an inspection apparatus of the present invention.
Figure 2:
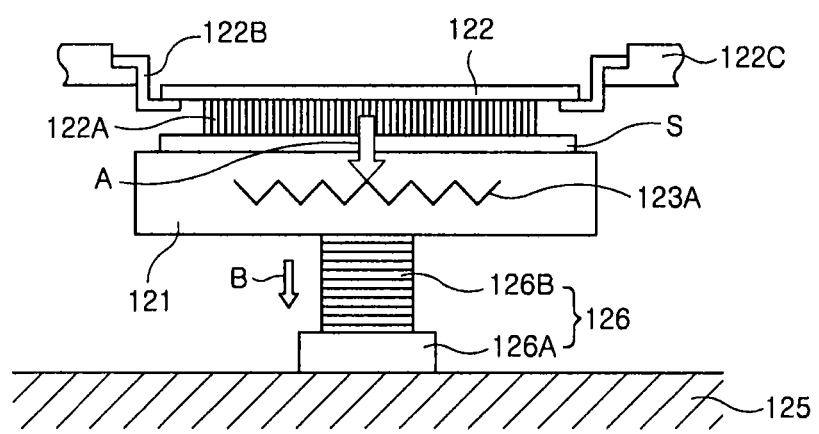
FIG. 2 explains movement of principal units of the inspection apparatus in the case of implementing a method for thermal stabilization of a probe card of the present invention by using the inspection apparatus shown in FIG. 1.

First, an inspection apparatus in accordance with an embodiment of the present invention will be described with reference to FIGS. 1 and 2. As shown in FIG. 1, for example, an inspection apparatus 10 of the present embodiment includes a loader chamber 11 for transferring an inspection target (e.g., wafer), a prober chamber 12 for inspecting electrical characteristics of a wafer, and a control unit 13 for controlling various devices provided in the loader chamber 11 and the prober chamber 12.

As shown in FIG. 1, the loader chamber 11 has a cassette accommodating unit 111 for accommodating wafers W in a cassette unit, a buffer table 112 for accommodating a heat transfer substrate S or a probe grinding wafer W1 which will be described later, a wafer transfer unit 113 for transferring the wafers W accommodated in the cassette accommodating unit 111 or the heat transfer substrate S accommodated in the buffer table 112, and a pre-alignment mechanism (not shown) for pre-aligning the wafers W or the heat transfer substrate S.

As shown in FIG. 1, the prober chamber 12 includes: a movable mounting table 121 for mounting thereon a wafer W; a probe card 122 provided above the mounting table 121, the probe card 122 having a plurality of probes 122A; a temperature control unit 123 for controlling a temperature of the mounting table 121 by heating or cooling the mounting table 121; and an alignment unit 124 for aligning the probes 122A and a plurality of electrode pads of the wafer W on the mounting table 121. The prober chamber is configured to inspect the electrical characteristics of the wafer W at a predetermined high temperature (e.g., about 150° C.) or a predetermined low temperature (e.g., about minus several tens of degrees Celsius) under the control of the control unit 13. In FIG. 1, the probe card 122 is fixed to a head plate 122C forming a top surface of the prober chamber 12 via a card holder 122B formed as one unit with the probe card 122.

The temperature control unit 123 for controlling the temperature of the mounting table 121 includes a heater 123A, a cooling jacket (not shown), and a temperature detector (not shown) for detecting a temperature of the mounting table 121. The temperature control unit 123 controls the mounting table 121 to a set temperature by heating or cooling the mounting table 121 based on the detection signal from the temperature detector. The mounting table 121 moves horizontally by an XY table 125 and vertically by a vertical drive mechanism 126 installed on the XY table 125.

The vertical drive mechanism 126 for vertically moving the mounting table 121 includes: a motor 126A; a rotational driving shaft 126B which is driven by the motor 126A to vertically move the mounting table 121; and a torque voltage detector 126C for detecting, as a torque voltage, a torque load transmitted from the motor 126A to the rotational driving shaft 126B. The mounting table 121 is raised by the rotational driving shaft 126B to bring the wafer W, the probe grinding wafer W1 or the heat transfer substrate S on the mounting table 121 into contact with the probes 122A of the probe card 122 at a predetermined target load (contact load obtained by overdriving the mounting table 121 (to allow the wafer W or the like to further press the probes 122A) by a predetermined distance from the contact start point between the heat transfer substrate S or the wafer W on mounting table and the probes 122A). The torque voltage detector 126C detects the torque voltage of the motor 126A and transmits the corresponding voltage to the control unit 13 as a digital signal.

Further, the alignment unit 124 includes a first CCD camera 124A installed at a side of the mounting table 121, and a second CCD camera 124C provided at an alignment bridge 124B. The images of the probes 122A of the probe card 122 are captured by the first CCD camera 124A and the images of the electrode pads of the wafer W are captured by the second CCD camera 124C. The probes 122A and the electrode pads of the wafer W are aligned based on the imaging results of the first and the second CCD camera 124A and 124C.

As shown in FIG. 1, the control unit 13 includes: a central processing unit 131 having an operation unit for converting the torque voltage from the torque voltage detector 126C into a torque load and a unit for comparing various data; an image processing unit 132 for processing imaging signals from the first and the second CCD camera 124A and 124C; and a storage unit 133 for storing a program for controlling the inspection apparatus 10, the contact load from the torque voltage detector 126C, the target load, and various data such as image data based on the image processing unit 132. The control unit 13 controls various devices of the inspection apparatus 10 and also displays various data on a display device (not shown).

In the method for thermal stabilization of a probe card in accordance with the present invention, the heat transfer substrate S is mounted on the mounting table 121, and the heat transfer substrate S is brought into direct contact with the probes 122A of the probe card 122. Accordingly, the temperature of the probe card 122 is controlled to a predetermined temperature, and the probe card 122 is thermally stabilized. The heat transfer substrate S is brought into direct contact with the probes 122A of the probe card 122 at a predetermined target load and used for controlling the probe card 122 to a predetermined temperature. Hereinafter, an embodiment of a method for thermal conduction of a probe card using the heat transfer substrate S will be described with reference to FIGS. 1 to 4. In the present embodiment, the target load is set and compared with the contact load, so that the degree of thermal expansion of the probe card 122 can be sequentially detected.

First, the case of preheating of the probe card 122 in the method for thermal stabilization of the probe card in accordance with the present embodiment will be described. In the case of pre-heating the probe card 122, as shown in FIG. 2, for example, the heat transfer substrate S is mounted on the mounting table 121 heated by the heater 123A, and then brought into direct contact with the probes 122A of the probe card 122 at a predetermined target load. Next, the probe card 122 is pre-heated to a temperature required for the high-temperature inspection of the wafer W (e.g., about 150° C.) in a short period of time, and the vertical movement of the mounting table 121 is controlled based on the thermal changes in the probe card 122. Accordingly, the probe card 122 can be thermally stabilized and, further, the electrical characteristics of the wafer W can be inspected immediately after the heat transfer substrate S is replaced with the wafer W.

The heat transfer substrate S is made of a highly thermal conductive material, e.g., aluminum, silicon or the like. As for the heat transfer substrate S, a probe grinding wafer W1 for grinding the probes 122A may be used. Here, in order to bring the probes 122A into contact with and the heat transfer substrate S at a predetermined target load, it is required to accurately detect the tip heights of the probes 122A by aligning the probes 122A. By accurately detecting the tip heights of the probes 122A, the contact start point between the heat transfer substrate S and the probes 122A can be accurately set.

Therefore, in the present embodiment, prior to the probe alignment, the tip heights of the probes 122A are accurately detected by a probe tip detection method suggested by the present applicant in, e.g., Japanese Patent Application Publication No. 2007-324340, and, then, the method for thermal stabilization of the probe card is performed.

Hereinafter, the probe tip detection method used in the present embodiment will be described. In the probe tip detection method, as shown in FIGS. 3A to 3F, a load sensor 127 provided at a side of the mounting table 121 and a pin 128 provided at an end of the alignment bridge 124B are used. The load sensor 127 includes a sensor portion 127A for detecting a contact load, a vertically movable cylinder portion 127B for resiliently moving up and down the sensor portion 127A, and a sensor (not shown) for detecting an upper and a lower position of the cylinder portion 127B. The sensor portion 127A detects the tip heights of the probes 122A by the contact load obtained when the load sensor 127 comes to contact with the probes 122A via the alignment unit 124. By allowing the pin 128 to contact with the sensor portion 127A of the load sensor 127 and apply a predetermined load (e.g., 30 gf±10%) thereto, whether or not the load sensor 127 is in a normal operation can be checked. By using the load sensor 127 and the pin 128, the tip heights of the probes 122A are detected as shown in FIGS. 3A to 3F. Hence, the contact start point between the probes 122A and the wafer W, the heat transfer substrate S or the probe grinding wafer W1 can be accurately detected and, further, the thermal changes in the probe card 122 can be accurately detected.

Figure 3A:
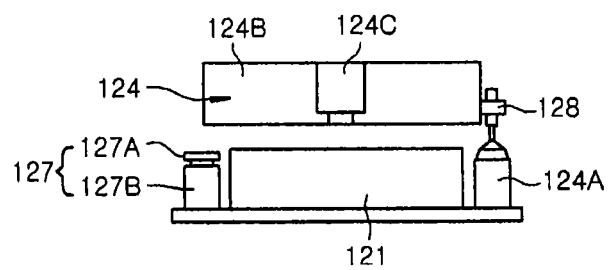
FIGS. 3A to 3F show processes for detecting a height of a probe tip in the case of implementing the method for thermal stabilization of a probe card of the present invention by using the inspection apparatus shown in FIG. 1.

Hereinafter, the probe tip detection method will be described with reference to FIGS. 3A to 3F. First, the alignment bridge 124B of the alignment unit 124 moves into the probe center, as shown in FIG. 3A. At the same time, the mounting table 121 is moved, and the first CCD camera 124A detects the leading end of the pin 128 by searching the pin 128 installed at the alignment bridge 124B and focusing at the leading end of the pin 128. The control unit 13 registers the height of the mounting table 121 at this time in the storage unit 133. The focal lengths of the first and the second CCD camera 124A and 124C are registered in advance in the storage device 133, and the central processing unit 131 calculates the leading end height of the pin 128 based on the height of the mounting table 121 and the focal length of the first CCD camera 124A. The leading end surface height of the pin 128 at this time and the X and Y position of the pin 128 are registered in the storage device 133.

Figure 3B:
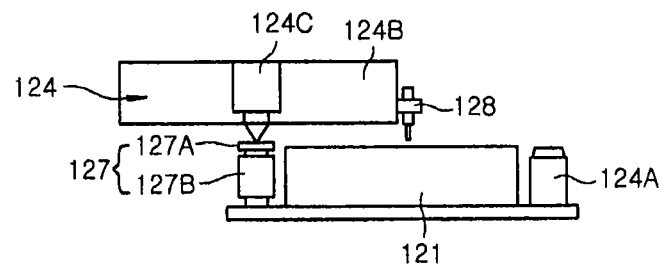

Next, in the load sensor 127, the top surface of the sensor portion 127A is raised from the cylinder portion 127B via the control unit 13 up to a position higher than the mounting surface of the mounting table 121. At the same time, the mounting table 121 is moved, and the second CCD camera 124C of the alignment bridge 124B detects the load sensor 127 by searching and detects the load sensor 127 and focusing at the top surface of the sensor portion 127A, as shown in FIG. 3B. The control unit 13 recognizes the height of the mounting table 121 at this time as the height of the load sensor 127 and registers such height in the storage unit 133 together with X and Y positions at this time.

Figure 3C:
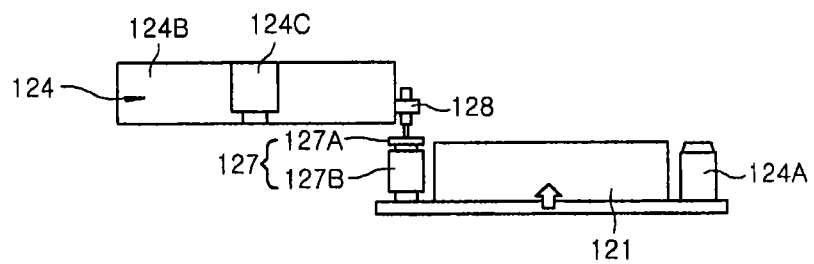
Figure 3D:
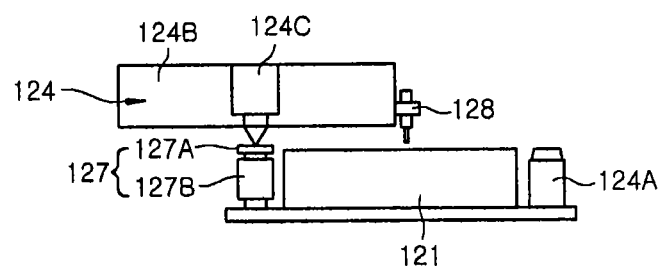

Then, the load sensor 127 is moved through the mounting table 12 and stopped at a position immediately below the pin 128. In that position, the top surface of the sensor portion 127A is raised by the mounting table 121 and brought into the contact with the pin 128 as shown in FIG. 3C, and whether or not the load sensor 127 is in a normal operation is checked. After the operation of the load sensor 127 is checked, as shown in FIG. 3D, the load sensor 127 is moved by the mounting table 121, and the second CCD camera 124C detects the top surface of the sensor portion 127A of the load sensor 127 in order to check the height of the top surface of the sensor portion 127A.

Figure 3E:
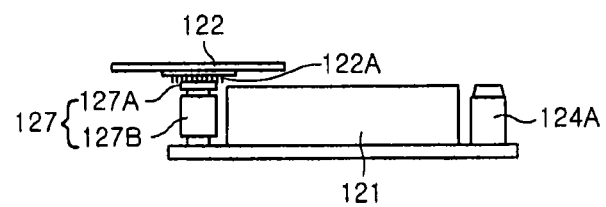

Thereafter, the alignment bridge 124B retreats from the probe center under the control of the control unit 13. Then, when the load sensor 127 is moved by the mounting table 121 to reach a location immediately below the probe card 122 as shown in FIG. 3E, the mounting table 121 is stopped and raised from this position. When the top surface of the sensor portion 127A of the load sensor 127 comes to contact with the probes 122A, the mounting table 121 is stopped by the control unit 13. The tip height of the probes 122A is determined based on the height of the mounting table 121 at this time. Such height is recognized by the control unit 13 and registered in the storage unit 133.

Figure 3F:
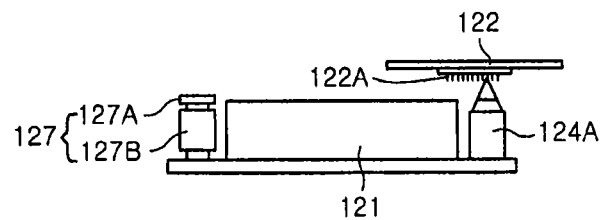
Figure 4:
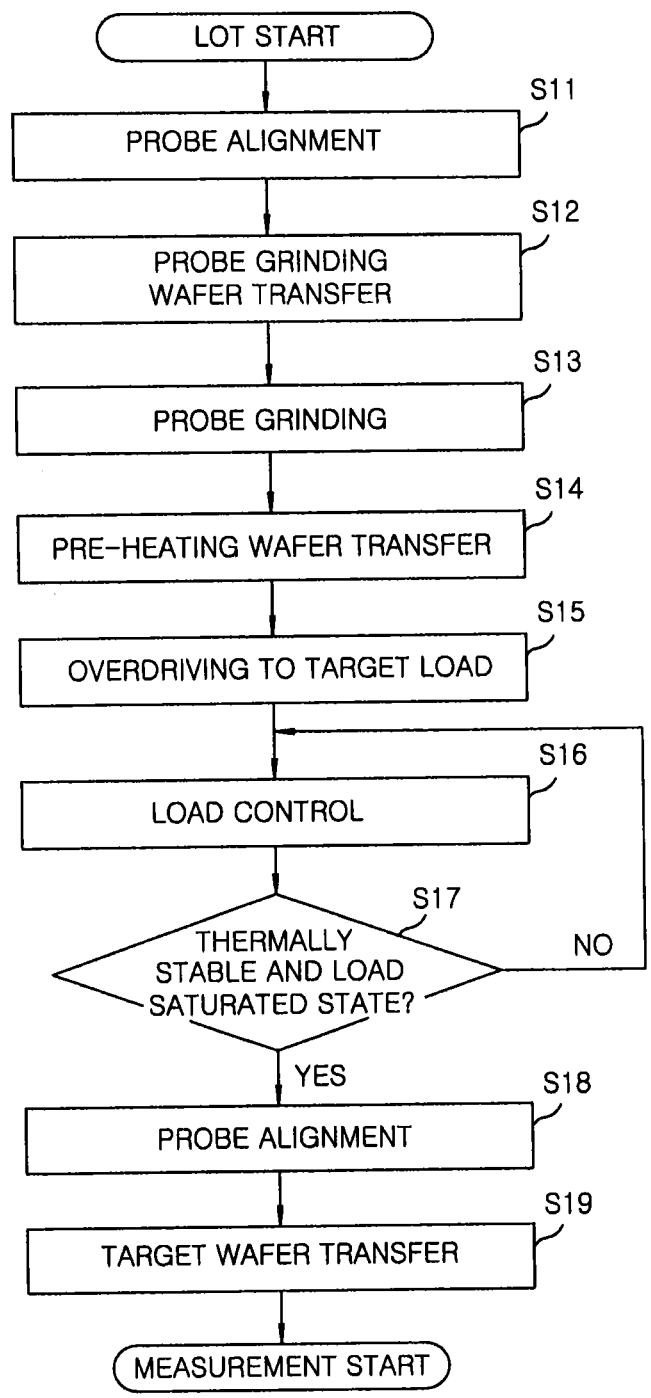
FIG. 4 is a flowchart showing a sequence of an embodiment of the method for thermal stabilization of a probe card of the present invention by using the inspection apparatus shown in FIG. 1.
Figure 5:
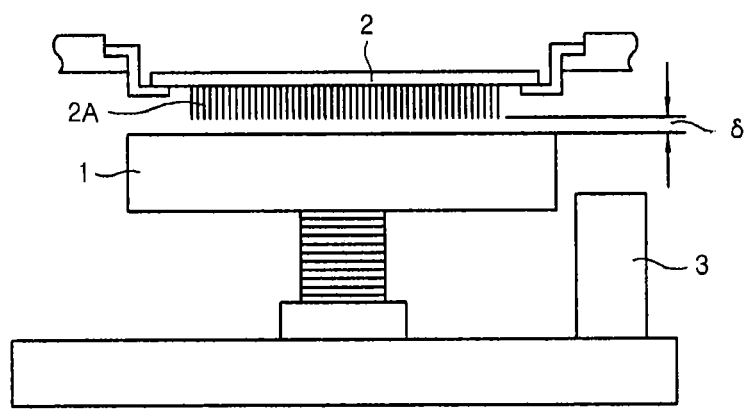
FIG. 5 explains principal parts of a conventional inspection apparatus.
Figure 6:
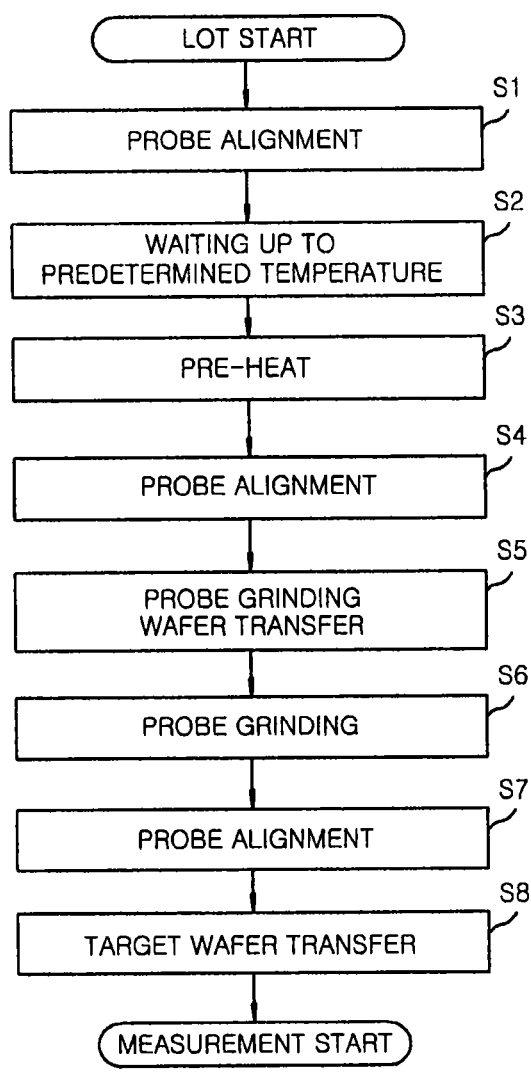
FIG. 6 is a flowchart showing a sequence of an example of a conventional method for thermal inspection of a probe card using the inspection apparatus shown in FIG. 5.

Next, the mounting table 121 is moved based on the tip heights of the probes 122A registered in the storage unit 133. Then, as shown in FIG. 3F, the tips of the probes 122A are detected by performing the probe alignment of the probe card 122 by using the first CCD camera 124A (step S11). At this time, since the tip heights of the probes 122A have been detected by an optical method using the first CCD camera 124A, the first CCD camera 124A can be accurately focused at the tips of the probes 122A.

After the tip heights of the probes 122A are detected in the step S11, the probe grinding wafer W1 is transferred from the buffer table 112 onto the mounting table 121 by using the wafer transfer unit 113 of the loader chamber 11 (step S12). Thereafter, the mounting table 121 is raised to bring the probe grinding wafer W1 into contact with the probes 122A. As a consequence, the probes 122A are grinded, and deposits on the probes 122A are removed (step S13). When the probe grinding wafer W1 may be used as the heat transfer substrate S, the probe grinding wafer W1 is used for pre-heating the probe card 122. When the probe grinding wafer W1 has low thermal conductivity, the probe grinding wafer W1 is replaced with the heat transfer substrate S and the pre-heating is carried out. In the case of replacing the probe grinding wafer W1, the probe grinding wafer W1 is returned to the buffer table 112 by using the wafer transfer unit 113, and the heat transfer substrate S is transferred from the buffer table 112 onto the mounting table 121 (step S14).

After the heat transfer substrate S is mounted on the mounting table 121 in the step S14, the mounting table 121 is moved to a position immediately below the probe card 122 and then raised from that position to bring the heat transfer substrate S into contact with the probes 122A. At this time, since the tip heights of the probes 122A have been accurately detected in advance, the heat transfer substrate S on the mounting table 121 is raised to the needle tip heights of the probes 122A through the vertical drive mechanism 126, and the heat transfer substrate S is brought into precise contact with the probes 122A at the contact start point. Further, the heat transfer substrate S is raised by a predetermined overdrive amount, so that the heat transfer substrate S is brought into contact with the probes 122A at a predetermined target load, as indicated by an arrow A in FIG. 2 (step S15). During this time the temperature of the probe card 122 is gradually increased by being pre-heated via the heat transfer substrate S on the mounting table 121, so that the probe card 122 is thermally expanded.

The probe card 122 is thermally expanded by heat transferred from the heat transfer substrate S on the mounting table 121, and the contact load between the probes 122A and the heat transfer substrate S is gradually increased compared to the target load. In the meantime, the torque voltage detector 126C detects the torque voltage of the motor 126A of the vertical drive mechanism 126, and the detection signal is transmitted to the central processing unit 131.

The central processing unit 131 calculates the contact load between the heat transfer substrate S and the probes 122A based on the signal from the torque voltage detector 126C, and compares the contact load with the target load read out from the storage unit 133. When the contact load exceeds the target load by the thermal expansion of the probe card 122, the central processing unit 131 controls the motor 126A to rotate in a reverse direction, so that the mounting table 121 is gradually lowered as indicated by an arrow B in FIG. 2 to thereby decrease the contact load to the target load (step S16).

When the heat transfer substrate S and the probe card 122 have a temperature difference therebetween, the thermal expansion of the probe card 122 is continued and, thus, the contact load is gradually increased. Accordingly, the central processing unit 131 checks at predetermined time intervals whether or not the temperature of the probe card 122 reaches the temperature of the heat transfer substrate S and whether or not a load saturated state in which the contact load is equal to the target load has been obtained (step S17). When it is determined that the load saturated state has not been obtained, the process returns to the step S16, and the mounting table 121 is lowered so that the contact load becomes the target load. When the temperature of the probe card 122 reaches the temperature of the heat transfer substrate S and the central processing unit 131 determines based on the torque voltage signal from the torque voltage detector 126C in the step S17 that the load saturated state has been obtained, the mounting table 121 is lowered to separate the heat transfer substrate S from the probe card 122, and the pre-heating is stopped.

Next, X and Y coordinates and the tip height (Z coordinate) of the probes 122A are obtained by performing the probe alignment of the pre-heated probe card 122 as in the step S11 (step S18). Thereafter, the heat transfer substrate S is returned to the original position in the buffer table 112 by the wafer transfer unit 113 in the loader chamber 11, and a target wafer W is transferred from the cassette accommodating unit 111 onto the mounting table 121 (step S19). Then, the electrical characteristic of the wafer are inspected. When the electrical characteristics of the wafer W are inspected, the probe card 122 has already been thermally stabilized. Therefore, if the wafer W is brought into contact with the probes 122A and raised by a constant overdrive amount during the inspection, the wafer W is brought into contact with the probes 122A under a constant target load, which ensures the reliable inspection.

As described above, in accordance with the present embodiment, in the method for thermal stabilization of the probe card using the inspection apparatus 10, the heat transfer substrate S is mounted on the mounting table 121, and the temperature of the heat transfer substrate S is adjusted via the mounting table 121. The mounting table 121 is raised so that the heat transfer substrate S comes to contact with the probes 122A at a predetermined target load. The contact load between the heat transfer substrate S and the probes 122A, which is increased by the thermal expansion of the probe card 122 by the heat from the heat transfer substrate S, is detected, and the vertical movement of the mounting table 121 is controlled by the vertical drive mechanism 126 such that the contact load becomes a predetermined target load until the probe card 122 is thermally stabilized. Accordingly, the probe card 122 can be heated to and thermally stabilized at a temperature required for the high-temperature inspection of the wafer W in a short period of time by bringing the heat transfer substrate S heated to the temperature required for the high-temperature inspection of the wafer W into direct contact with the probe card 122 and, also, the progress of the pre-heating of the probe card 122 can be easily detected by the contact load.

Further, in accordance with the present embodiment, the thermal expansion of the probe card 122 is monitored by the contact load between the wafer W and the probes 122A, so that the timing at which the contact load is not changed is determined as the timing at which the thermal expansion of the probe card 122 is completed. Moreover, the probe card 122 can be pre-heated while heating the mounting table 121. As a result, the pre-heating time can be shortened.

The present invention is not limited to the above-described embodiment, and the components of the present invention may be properly modified. Although the method for thermal stabilization of the probe card in the above-described embodiment includes the process using the probe grinding wafer, such process may be omitted when the probe grinding operation is unnecessary.

DESCRIPTION OF REFERENCE NUMERALS 10 inspection apparatus
121 mounting table
122 probe card
122A probe
126 vertical drive mechanism
126A motor
126B rotational driving shaft
126C torque voltage detector (contact load detector)
13 control unit
131 central processing unit
133 storage unit
S heat transfer substrate
W wafer (inspection target)

What is claimed is:
1. A method for thermal stabilization of a probe card by using an inspection apparatus including: a horizontally and vertically movable mounting table; a probe card having a plurality of probes, disposed above the mounting table; a vertical drive mechanism configured to vertically move the mounting table; a temperature control unit configured to control a temperature of the mounting table; and a control unit configured to control the vertical drive mechanism and the temperature control unit, wherein before inspecting electrical characteristics of an inspection target at a predetermined temperature, the probe card is thermally stabilized by mounting a heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, the method comprising:

a first step of mounting the heat transfer substrate on the mounting table and adjusting a temperature of the heat transfer substrate through the mounting table;

a second step of bringing the heat transfer substrate into contact with the probes at a predetermined target load by raising the mounting table;

a third step of detecting the contact load between the heat transfer substrate and the probes which changes in conformity with thermal changes in the probe card that exchanges heat with respect to the heat transfer substrate; and a fourth step of controlling vertical movement of the mounting table through the vertical drive mechanism such that the contact load becomes equal to the predetermined target load, until the probe card is thermally stabilized.

2. The method of claim 1, wherein the contact load is detected via a torque voltage of a motor included in the vertical drive mechanism.

3. The method of claim 1, wherein the target load is obtained by overdriving the mounting table.

4. The method of claim 1, wherein the heat transfer substrate is made of a highly thermal conductive material.

5. An inspection apparatus comprising: a horizontally and vertically movable mounting table; a probe card having a plurality of probes, disposed above the mounting table; a vertical drive mechanism configured to vertically move the mounting table; a temperature control unit configured to control a temperature of the heat transfer substrate through the mounting table; and a control unit configured to control the vertical drive mechanism and the temperature control unit, wherein before inspecting electrical characteristics of an inspection target at a predetermined temperature, the probe card is thermally stabilized by mounting the heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, the inspection apparatus further comprising:

a load detector configured to detect the contact load, wherein the control unit controls the vertical movement of the mounting table through the vertical drive mechanism based on a signal from the load detector, until the probe card is thermally stabilized and the contact load is kept at the target load.

6. The inspection apparatus of claim 5, wherein the target load is obtained by overdriving the mounting table.

7. The inspection apparatus of claim 5, wherein the heat transfer substrate is made of a highly thermal conductive material.

8. An inspection apparatus comprising: a horizontally and vertically movable mounting table; a probe card having a plurality of probes, disposed above the mounting table; an vertical drive mechanism configured to vertically move the mounting table; a temperature control unit configured to control a temperature of the heat transfer substrate through the mounting table; and a control unit configured to control the vertical drive mechanism and the temperature control unit, wherein before inspecting electrical characteristics of an inspection target at a predetermined temperature, the probe card is thermally stabilized by mounting the heat transfer substrate on the mounting table, adjusting the probe card to a predetermined temperature through the heat transfer substrate on the mounting table of which temperature is adjusted by the temperature control unit, and controlling a contact load between the heat transfer substrate and the probes to a predetermined target load by vertically moving the mounting table through the vertical drive mechanism, wherein the vertical drive mechanism includes: a motor; a rotational driving shaft, connected to the motor, for vertically moving the mounting table; a torque voltage detector for detecting a torque voltage of the motor during the rotation of the rotational driving shaft, and wherein the control unit has a central processing unit for converting the torque voltage from the torque voltage detector into a contact load between the heat transfer substrate and probes, and the vertical movement of the mounting table is controlled based on a signal from the torque voltage detector such that the contact, load becomes the target load, until the probe card is thermally stabilized.

9. The inspection apparatus of claim 8, wherein the target load is obtained by overdriving the mounting table.

10. The inspection apparatus of claim 8, wherein the heat transfer substrate is made of a highly thermal conductive material.

* * * * *